United States Patent [19]
Kitagawa

[11] Patent Number: 5,243,130
[45] Date of Patent: Sep. 7, 1993

[54] HOUSING PROVIDED WITH CONDUCTIVE WIRES THEREIN

[75] Inventor: Hiroji Kitagawa, Nagoya, Japan

[73] Assignee: Kitagawa Industries Co., Ltd., Japan

[21] Appl. No.: 793,636

[22] Filed: Nov. 18, 1991

[30] Foreign Application Priority Data

Nov. 28, 1990 [JP] Japan .................... 2-331901

[51] Int. Cl.⁵ .................................. H05K 5/00
[52] U.S. Cl. ........................... 174/50; 361/792
[58] Field of Search ............... 174/50; 361/414, 412; 264/112, 255, 272.11

[56] References Cited

U.S. PATENT DOCUMENTS 3,590,136 6/1971 Kunishi et al. ............ 174/50
4,697,863 10/1987 Galloway et al. .

FOREIGN PATENT DOCUMENTS 0250006 12/1987 European Pat. Off. .
917389 1/1958 United Kingdom .
942236 11/1963 United Kingdom .
1073108 2/1966 United Kingdom .
2095039 9/1982 United Kingdom .
2220107 12/1989 United Kingdom .
WO86/02518 4/1986 World Int. Prop. O. .

*Primary Examiner*—Harold Broome
*Attorney, Agent, or Firm*—Davis, Bujold & Streck

[57] ABSTRACT

A housing provided with centrally located electrically-conductive wires and apertures which extend to the conductive wires located inside the walls of the housing. When electrically conductive members are inserted into the apertures and touch the electrically conductive wires, electrical connection can be obtained. Thus, the conductive wires inside the wall of the housing easily allow connection between electronic components or between the electronic components and a power source. The housing is also advantageous in miniaturizing electronic equipment.

20 Claims, 1 Drawing Sheet

HOUSING PROVIDED WITH CONDUCTIVE WIRES THEREIN

BACKGROUND OF THE INVENTION

This invention relates to a housing for disposing electronic components or the like therein. Conventionally, in electronic equipments such as transmitters, printed boards provided with a plurality of electronic components thereon have been used for disposing various electronic components into housings. In such a conventional electronic equipment, each electronic component is fixed by solder into an aperture in the printed board. The apertures are connected to each other by conductive members or a conductive pattern previously formed on the printed board for maintaining electrical connection. The printed board is then fixed to the inside of a housing by screws or other attaching means.

In the aforementioned techniques, printed boards or other members are adopted to connect a variety of electronic components to each other and to dispose the electronic components into the housing. However, the printed boards must have a pattern previously formed thereon. Connecting a lot of conductive members to each other also takes a long time. Moreover, miniaturization of electronic equipments is hampered by ineffective use of space because the conductive members and the printed boards occupy a large space inside the housing.

SUMMARY OF THE INVENTION

Wherefore, an object of the present invention is to provide a housing in which electronic components are easily connected to each other without hampering miniaturization of the electronic equipment.

A housing, for containing electronic components, being manufactured from a resin and having a plurality of interconnected walls, the housing comprising at least one electrically conductive wire being provided inside said plurality of interconnected walls for achieving an electrical connection therethrough; and a plurality of apertures being provided in said plurality of interconnected walls, said plurality of apertures extending to and communicating with said at least one electrically conductive wire to allow electrical connection between electronic components, when installed, and the at least one electrically conductive wire.

A method of manufacturing a multi-layer housing, for containing electronic components, being manufactured from a resin and having a plurality of interconnected walls, the housing comprising at least one electrically conductive member being provided inside said plurality of interconnected walls for achieving an electrical connection therethrough; and a plurality of apertures being provided in said plurality of interconnected walls, said plurality of apertures extending to and communicating with said at least one electrically conductive member, the method comprising the steps of:

a) forming by molding an outer body of the housing;

b) applying a powdered electrically conductive material on an inner surface of the outer body;

c) applying a binder and a solvent to the powdered electrically conductive material and kneading the powder, the binder and the solvent into a paste;

d) forming the paste into a desired first electrically conductive member on the inner surface of the outer body;

e) allowing the paste to dry;

f) molding a central body, having a plurality of first spaced apertures extending to and communicating with the first electrically conductive member, to the inner surface of the outer body;

g) applying a powdered electrically conductive material on an inner surface of the central body;

h) applying a binder and a solvent to the powdered electrically conductive material on the inner surface of the central body and kneading the powder, the binder and the solvent into a paste;

i) forming the paste into a desired second electrically conductive member on the inner surface of the central body; j) allowing the paste to dry; and k) molding an inner body, having a plurality of first spaced apertures and communicating with the previously formed first spaced apertures and a plurality of second spaced apertures extending to and communicating with the second electrically conductive member, to form the multi-layer housing. In order to achieve the above object, a housing of the present invention comprises walls made of resin in which electrically conductive wires are disposed and apertures are provided in the walls and communicate with the electrically conductive wires. The resin mentioned above can be a conventional synthetic resin which is hard to deform under the weight of the electronic equipment, such as hydrocarbon resin (polyethylene, polypropylene, polystyrene and ABS resin), acrylic resin, polyvinyl acetate resin, halogen resin, polyester resin, polyamide resin, polyether resin, phenolic resin, amino resin, polyurethane resin and epoxy resin.

The conductive wires can be made of any electrically conductive material such as silver, copper or electrically conductive adhesives. These materials can simply be aligned on a wall if the material is linear. Alternatively, such material in paste form may be applied onto the walls. An outer body and an inner body of the housing can be manufactured separately by a double-layer molding. The housing can also be composed of two or more laminated parts, i.e one laminated part covers the electrically conductive wires carried by the other laminated part.

Guide elements can be formed on the surface of the housing along the conductive wires for indicating the positions of the wires. The guide elememts can be a relief, indentation or aperture formed on the surface or painted colors to make a distinction between the wires. The apertures are open on the surface of the housing. The apertures can be provided on either side of the housing.

DETAILED DESCRIPTION OF THE PREFERRED EMBODIMENTS

Figure 1:
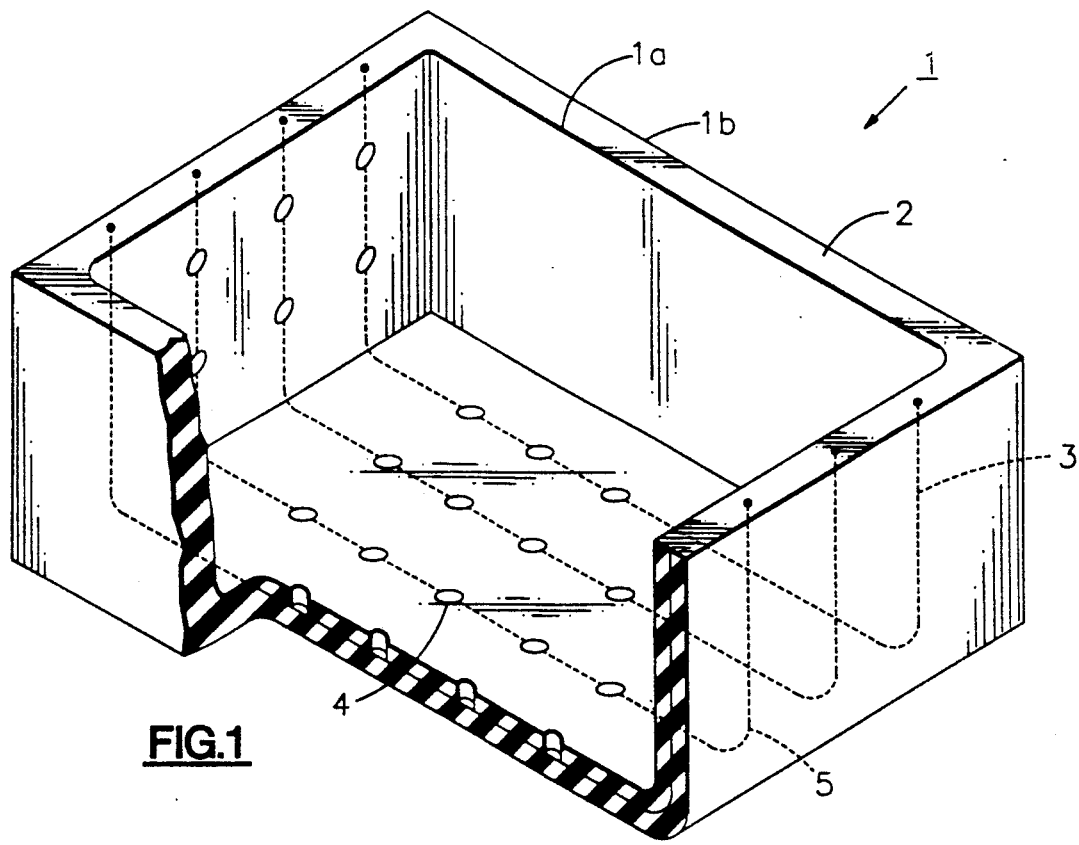
FIG. 1 is a partially cutaway view in perspective of a housing of a first embodiment.

Embodiments of the present invention will now be explained in detail hereunder referring to the drawings.

FIG. 1 shows a housing of a first embodiment according to the present invention. The housing 1 is made of hard resin such as polyvinyl chloride, polypropylene and ABS resin. As shown in the figure, the housing 1 comprises an inner body 1a which has five interconnected walls to form a box-shaped member with an open top, and an outer body 1b which has five interconnected walls and is larger than the inner body 1a. The inner body 1a and the outer body 1b are integrally connected to one another to form the housing 1. Inside the walls 2 of the housing 1, a plurality of conductive wires 3 are sandwiched in parallel between the inner body 1a and the outer body 1b. The conductive wires 3 contain a conductive material such as silver. In the inner layer of the housing 1 (inner body 1a), a plurality of spaced apertures 4 are provided in line corresponding to each of the conductive wires 3. The plurality of the apertures 4 are open on the inner surface of the housing 1 and extend to and communicate with the conductive wires 3. In this embodiment, the apertures 4 are not provided in the outer body 1b, but only in the inner body 1a. Guides 5 are formed on the inner surface of the housing 1 corresponding to the conductive wires 3 for indicating the position of the conductive wires 3.

The housing 1 of this embodiment is manufactured in the method described below.

The outer body 1b is molded of the aforementioned synthetic resin by injection molding or the like. In order to form the conductive wires 3 on the inner surface of the outer body 1b, silver another electrically conductive material is first powdered. Secondly, the powder, a binder such as an epoxy resin, and a solvent are knead into a paste and applied in a line, or another desired configuration, on the inner surface of the outer body 1b, and then dried. The electrically conductive material mentioned above can include carbon fibers plated with, for instance, copper (Cu) or silver (Ag).

The inner body 1a is formed by a so-called double-layer molding inside the outer body 1b covering the conductive wires 3. Specifically, the inner body 1a is formed between the outer body 1b and a mold which is previously provided with protrusions in order to form the apertures 4. Subsequently, the guides 5 are formed by painting or applying different colors or indicia on the inner surface of the inner body 1a along the conductive wires 3.

The effect of the housing thus constructed will now be explained.

The housing 1 of the present embodiment is provided with the conductive wires 3 inside the walls 2 of the housing 1 made of resin. The housing 1 is further provided with the apertures 4 in the inner body 1a. The apertures 4 extend to the conductive wires 3. Therefore, in disposing electronic components in the housing 1, electrical connection is easily obtained by inserting unshown electrically conductive members into the apertures 4 for connecting the electronic components to the conductive wires 3. Thus, electrical connection between electronic components or between the electronic components and a power source can be easily obtained without using printed boards or cords. Since the structure of the present invention minimizes the volume of conductive members or other parts around the disposed electronic components, an electronic equipment that uses the housing 1 of the present invention has the advantage of being smaller in size. Moreover, provided with the guides 5 along the conductive wires 3, the housing 1 of the present invention prevents incorrect electrical connections.

Figure 2:
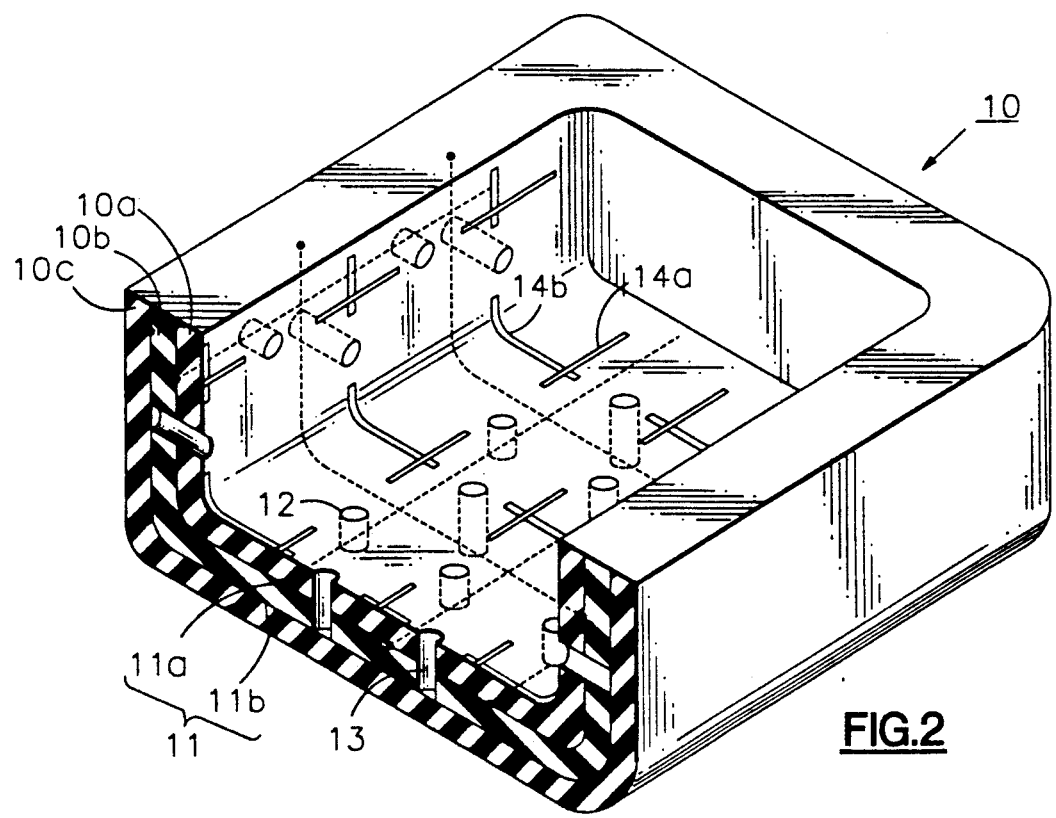
FIG. 2 is a partially cutaway view in perspective of a housing of a second embodiment.

A housing 10 of a second embodiment according to the present invention will now be explained hereunder referring to FIG. 2.

The housing 10 of this embodiment comprises an inner body 10a, a central body 10b and an outer body 10c. The inner body 10a, the central body 10b and the outer body 10c are laminated together integrally to form the housing 10. Provided between the inner body 10a and the central body 10b, and between the central body 10b and the outer body 10c are longitudinal conductive wires 11a and lateral conductive wires 11b, respectively. The vertical conductive wires 11a and the horizontal conductive wires 11b are provided on different planes and do not come into contact with each other. In the inner body 10a, a plurality of shallow apertures 12 are provided in a series of longitudinal lines corresponding to the longitudinal conductive wires 11a. A plurality of deep apertures 13 penetrating both the central body 10b and the inner body 10a are provided in a series of 11b. The shallow apertures 12 and the deep apertures 13 extend to and communicate with the conductive wires 11a and the conductive wires 11b, respectively, and are open on the inner surface of the housing 10. Moreover, on the inner surface of the housing 10, guides 14a and guides 14b are provided to indicate the position of the conductive wires 11a and the conductive wires 11b, respectively. The housing 10 of this embodiment is manufactured by a similar method as in the first embodiment described above but composed of three layers, not two layers as in the first embodiment. By providing longitudinal conductive wires 11a and lateral conductive wires 11b in one housing 10, the second embodiment of the present invention enables complicated wirings to be achieved. The conductive wires 3 and the lateral and longitudinal conductive wires 11b, 11a are connected, as is known in this art, to a power source or other component.

This invention has been described above with reference to preferred embodiments as shown in the drawings. Modification and alterations may become apparent to one skilled in the art upon reading and understanding the specification. Despite the use of the embodiments for illustration purposes, however, it is intended to include all such modifications and alterations within the scope and the spirit of the appended claims.

In this spirit, it should also be noted that in the embodiments as shown and described, the inner body 1a, the inner body 10a and the central body 10b are formed by a double-layer molding or a triple-layer molding. However, the inner body 1a and the inner body 10a can be formed separately from the outer body 1b and the outer body 10c, and then fitted in the outer body 1b or the outer body 10c to form the housing 1 and 10, respectively. The guides 5, 14a and 14b can not only be painted colors but may be codes, characters or other indicia formed on the surface of the inner body 1a and the inner body 10a.

Wherefore, having described the present invention, what is claimed is:

1. A housing, for containing electronic components, being manufactured from a resin and having a plurality of interconnected walls, the housing comprising:

at least one electrically conductive wire being provided inside said plurality of interconnected walls for achieving an electrical connection therethrough; and a plurality of apertures being provided in said plurality of interconnected walls, said plurality of apertures extending to and communicating with said at least one electrically conductive wire to allow electrical connection between an electronic component, when installed, and said at least one electrically conductive wire, wherein the housing is a double-layer molded housing consisting of an inner body an and outer body with said at least one electrically conductive wire sandwiched therebetween, and guide elements are formed on a surface of the housing, adjacent said at least one electrically conductive wire, for indicating a position of said at least one electrically conductive wire.

2. A housing according to claim 1, wherein said guide elements consist of one of an indicia, a color, a code and a character applied to a surface of the housing.

3. A housing according to claim 1, wherein said at least one electrically conductive wire is formed of a material selected from the group consisting of silver, copper an electrically conductive adhesive, carbon fiber plated with copper and carbon fiber plated with silver.

4. A housing according to claim 1, wherein a plurality of electrically conductive wires are provided inside the plurality of interconnected walls.

5. A housing according to claim 1, wherein the plurality of interconnected walls of the housing form a box-shaped housing, defining a cavity, and having an opening for providing access to the cavity of the box-shaped housing.

6. A housing, for containing electronic components, being manufactured from a resin and having a plurality of interconnected walls, the housing comprising:
  at least one electrically conductive wire being provided inside said plurality of interconnected walls for achieving an electrical connection therethrough; and
  a plurality of apertures being provided in said plurality of interconnected walls, said plurality of apertures extending to and communicating with said at least one electrically conductive wire to allow electrical connection between an electronic component, when installed, and said at least one electrically conductive wire,
  wherein said housing is a double-layer laminated housing consisting of an inner body and an outer body with said at least one electrically conductive wire sandwiched therebetween, and
  guide elements are formed on a surface of the housing, adjacent said at least one electrically conductive wire, for indicating a position of said at least one electrically conductive wire.

7. A housing according to claim 6, wherein said guide elements consists of one of an indicia, a color, a code and a character applied to a surface of the housing.

8. A housing according to claim 6, wherein said at least one electrically conductive wire is formed of a material selected from the group consisting of silver, copper and electrically conductive adhesive, carbon fiber plated with copper and carbon fiber plated with silver.

9. A housing according to claim 6, wherein a plurality of electrically conductive wires are provided inside the plurality of interconnected walls.

10. A housing according to claim 6, wherein the plurality of interconnected walls of the housing form a box-shaped housing, defining a cavity, and having an opening for providing access to the cavity of the box-shaped housing.

11. A housing, for containing electronic components, being manufactured from a resin and having a plurality of interconnected walls, the housing comprising:
  at least one electrically conductive wire being provided inside said plurality of interconnected walls for achieving an electrical connection therethrough; and
  a plurality of apertures being provided in said plurality of interconnected walls, said plurality of apertures extending to and communicating with said at least one electrically conductive wire to allow electrical connection between an electronic component, when installed, and said at least one electrically conductive wire, wherein the housing is a triple layer housing having an inner body, a central body and an outer body all integrally connected together to form the housing and a plurality of longitudinally extending conductive wires are provided between the inner body and the central body and a plurality of laterally extending conductive wires are provided between the central body and the outer body.

12. A housing according to claim 11, wherein the plurality of longitudinally extending conductive wires are provided in a different plane from the plurality of laterally extending conductive wires.

13. A housing according to claim 12, wherein a plurality of spaced shallow apertures are provided which extend through the inner body and communicate with the plurality of longitudinally extending conductive wires and a plurality of spaced apart deep apertures are provided which extend through the inner body and the central body and communicate with the plurality of laterally extending conductive wires.

14. A housing according to claim 11, wherein guide elements are formed on a surface of the housing, adjacent the plurality of longitudinal and lateral extending conductive wires for indicating the position thereof.

15. A housing according to claim 14, wherein said guide elements consist of one of an indicia, a color, a code and a character applied to a surface of the housing.

16. A housing according to claim 11, wherein the plurality of longitudinal and lateral electrically conductive wires are formed of a material selected from the group consisting of silver, copper and an electrically conductive adhesive.

17. A housing according to claim 11, wherein the plurality of interconnected walls of the housing form a box-shaped housing, defining a cavity, and having an opening for providing access to the cavity of the box-shaped housing.

18. A method of manufacturing a multi-layer housing, for containing electronic components, being manufactured from a resin and having a plurality of interconnected walls, the housing comprising at least one electrically conductive member being provided inside said plurality of interconnected walls for achieving an electrical connection therethrough; and a plurality of apertures being provided in said plurality of interconnected walls, said plurality of apertures extending to and communicating with said at least one electrically conductive member to allow electrical connection between electronic components, when installed, and the at least one electrically conductive wire, the method comprising the steps of:
  a) forming by molding an outer body of the housing;
  b) powdering an electrically conductive material;
  c) applying a binder and a solvent to the powdered electrically conductive material and kneading the powdered material, the binder and the solvent into a paste;

d) forming the paste into a desired electrically conductive member on the inner surface of the outer body;

e) allowing the paste to dry; and f) molding an inner body, having a plurality of first spaced apertures extending to and communicating with the electrically conductive member to form the multi-layer housing.

19. A method according to claim 18, further comprising the step of forming indicia on a surface of the housing to indicate a position of the electrically conductive member.

20. A method of manufacturing a multi-layer housing, for containing electronic components, being manufactured from a resin and having a plurality of interconnected walls, the housing comprising at least one electrically conductive member being provided inside said plurality of interconnected walls for achieving an electrical connection therethrough; and a plurality of apertures being provided in said plurality of interconnected walls, said plurality of apertures extending to and communicating with said at least on electrically conductive member to allow electrical connection between electronic components, when installed, and the at least one electrically conductive wire, the method comprising the steps of:

a) forming by molding an outer body of the housing;

b) powdering an electrically conductive material;

c) applying a binder and a solvent to the powdered electrically conductive material and kneading the powdered material, the binder and the solvent into a paste;

d) forming the paste into a desired first electrically conductive member on the inner surface of the outer body;

e) allowing the past to dry;

f) molding a central body, having a plurality of first spaced apertures extending to and communicating with the first electrically conductive member, to the inner surface of the outer body;

g) powdering an electrically conductive material;

h) applying a binder and a solvent to the powdered electrically conductive material and kneading the powdered material, the binder and the solvent into a paste;

i) forming the paste into a desired second electrically conductive member on the inner surface of the central body;

j) allowing the paste to dry;

k) molding an inner body, having a plurality of first spaced apertures communicating with the previously formed first spaced apertures and a plurality of second spaced apertures extending to and communicating with the second electrically conductive member, to form the multi-layer housing.

* * * * *